Oct. 7, 1969 J. M. SHAHEEN ETAL 3,471,348

METHOD OF MAKING FLEXIBLE CIRCUIT CONNECTIONS TO MULTILAYER CIRCUIT BOARDS

Filed Oct. 4, 1968 2 Sheets-Sheet 1

INVENTORS
JOSEPH M. SHAHEEN
PAMELA L. ILES
BY Robert G. Rogers
ATTORNEY

Oct. 7, 1969 J. M. SHAHEEN ETAL 3,471,348

METHOD OF MAKING FLEXIBLE CIRCUIT CONNECTIONS TO MULTILAYER CIRCUIT BOARDS

Filed Oct. 4, 1968 2 Sheets-Sheet 2

INVENTORS
JOSEPH M. SHAHEEN
PAMELA L. ILES
BY Robert D. Rogers
ATTORNEY

United States Patent Office 3,471,348

Patented Oct. 7, 1969

3,471,348

METHOD OF MAKING FLEXIBLE CIRCUIT CONNECTIONS TO MULTILAYER CIRCUIT BOARDS

Joseph M. Shaheen, La Habra, and Pamela L. Iles, Dana Point, Calif., assignors to North American Rockwell Corporation Filed Oct. 4, 1968, Ser. No. 765,220
Int. Cl. C23f *1/00;* C23g *1/00;* B44c *1/22*
U.S. Cl. 156—3 3 Claims

ABSTRACT OF THE DISCLOSURE

A flexible layer including an etched circuit pattern is disposed between circuit boards of the multilayer board. The circuit connections on the flexible layer are properly positioned during the process for forming the multilayer board so that desired interconnections are made between the flexible circuitry and multilayer board circuits.

BACKGROUND OF THE INVENTION

Field of the invention

The invention relates to multilayer boards having flexible connectors and, more particularly, to such boards in which the flexible connector is inserted between layers of the multilayer board.

Description of prior art

Existing processes for forming flexible connections to circuit terminals from circuits of a multilayer board ordinarily involve the use of a separately formed flexible connector having circuit terminations which are connected to circuit terminations at an edge of the multilayer board.

One example of the prior art can be seen by referring to Patent No. 3,325,691, for Flexible Printed Circuitry Terminations by F. B. Dahlgren, et al. In that patent, circuit terminations are formed by using grommeted tublets which are brazed to internal conductors. The tublet is subjected to mechanical distortion both in the application and the use stage.

Another example of the prior art can be seen by referring to U.S. Patent No. 3,221,095, for Flexible Connecting Terminals assembled by V. B. Cook. The patent teaches attaching eyelets to the conductors to form the terminations. When the flexible cable is assembled, solder temperatures melt the insulations around eyelets thereby causing the terminations to become mechanically weaker or to melt the solder fillet used to make the electrical contact, thereby causing a potentially cold joint.

It would be preferred, however, to eliminate flexible connectors requiring attachment to the edge of the circuit boards by using a flexible circuit connector which extends inside the board. However, care must be taken not to prepare the flexible circuit in such a manner that the edge of the flexible circuit is broken and damaged during the process.

SUMMARY OF THE INVENTION

Briefly, an electrically conductive layer, bonded to a flexible material, is etched according to a desired circuit configuration for mating with circuit terminations of electrical circuits of a multilayer board. Under ordinary circumstances, the conducting layer is interposed between two flexible layers.

Prior to assembling the multilayer board the required dimension of the flexible circuit connector is determined. After the determination is made, circuit boards having dimensions equal to the dimension of the flexible connector are processed. Although, only a portion of each board is used in producing electrical circuitry. The remaining portion of each board is used to protect the flexible circuitry during the process in which electrical interconnections are made between the boards.

After the through holes have been drilled and the connections made, the epoxy glass substrates of the boards on both sides of the flexible circuitry are etched away leaving the flexible circuitry centrally disposed between layers of the multilayer board. The opposite extremity of the flexible circuitry is then connected to signal sources, power sources, output loads, etc. as required to complete the electrical connections.

Therefore, it is an object of this invention to provide a flexible connection to a multilayer board which is interposed between layers of a multilayer board.

Still another object of this invention is to provide a flexible circuit which is formed during the process in which the multilayer board is formed and which is protected by portions of the multilayer boards during the process.

A still further object of this invention is to eliminate the necessity for separate flexible circuit connectors at the edge of multilayer boards.

A still further object of this invention is to provide a process for producing a flexible circuit connector which is integral with the layers of a multilayer board.

These and other objects of the invention will become more apparent in connection with the following drawings.

DESCRIPTION OF THE PREFERRED EMBODIMENT

Figure 1:
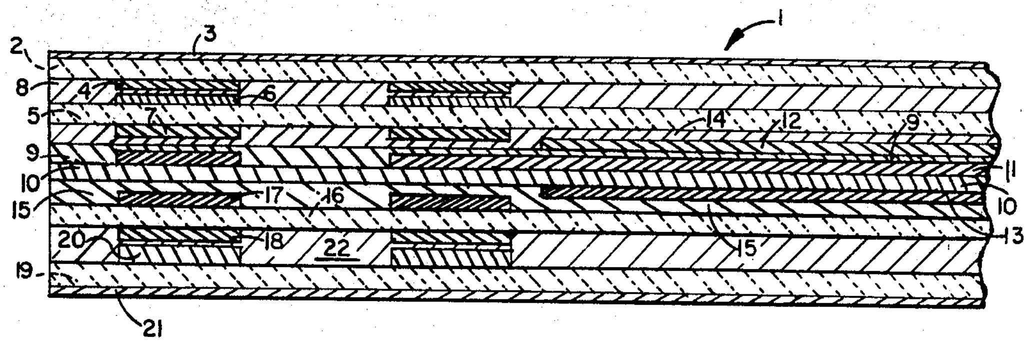
FIGURE 1 illustrates a cross-sectional view of a multilayer board after all the layers have been bonded together including a centrally disposed flexible layer.

FIGURE 1 shows multilayer board 1 comprising epoxy glass substrate 2 having copper layer 3 bonded to its outer surface and etched copper circuitry layer 4 bonded to its inner surface for forming a circuit board. The multilayer board also comprises epoxy glass substrate 5 having etched circuits 6 and 7 bonded on its surfaces for forming a second circuit board. Pre-impregnated layer 8 bonds the boards together.

Insulation and flexible layers 9 and 10 are disposed on both sides of etched circuitry layer 11. Additional conductive layers 12 and 13, such as copper sheets, are disposed on the outside surfaces of the flexible layers to protect the flexible layers as will be described subsequently. The layers are joined by a suitable adhesive such as epoxy. Pre-impregnated layers 14 and 1 bond the flexible layers 9 and 10, and layers 12 and 13 to adjacent circuitry boards.

Although various materials may be used as the insulation and flexible layers, materials sold under the trademarks Mylar and Kapton are preferred materials.

Substrate 16 has circuitry layers 17 and 18 bonded to its surfaces. Substrate 19 includes circuitry layer 20 bonded to the inner surface and copper layer 21 bonded to its outer surface. Pre-impregnated layer 22 bonds substrates 16 and 19, with their circuitry layers, together. The circuitry layers are adjacent to each other and insulated from each other by the prepreg layers.

Figure 2:
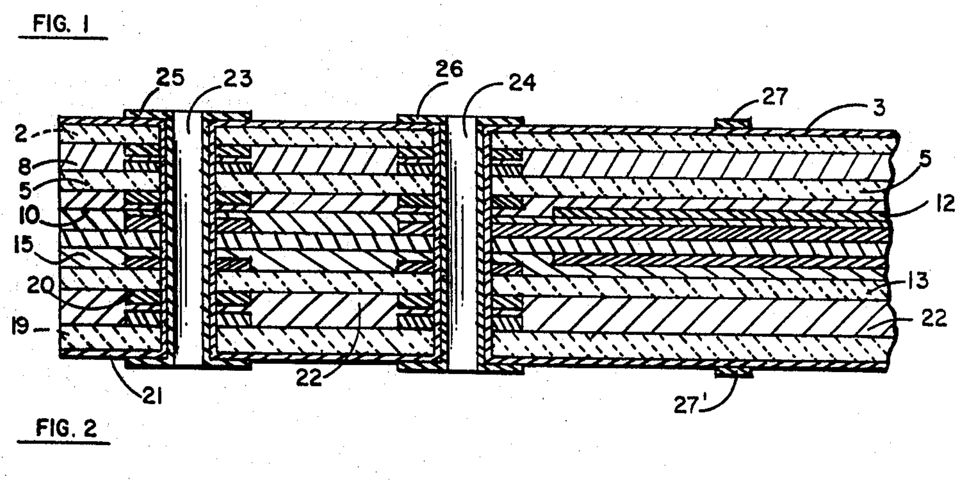
FIGURE 2 illustrates a cross-sectional view of a multilayer board after it has been processed to include holes and interconnections.

FIGURE 2 illustrates a further view of board 1 after through holes 23 and 24 have been drilled through selected locations and after the holes have been plated with gold. Gold layers 25 and 26 interconnect the circuits of the multilayer board. Drilling and plating processes are known to those skilled in the art and for that reason details are not included herein. Gold borders 27 and 27' have been deposited at the edge of the multilayer combination to define the dimensions of the multilayer board. Operators use the border as a guideline in removing the outside portion.

Figure 3:
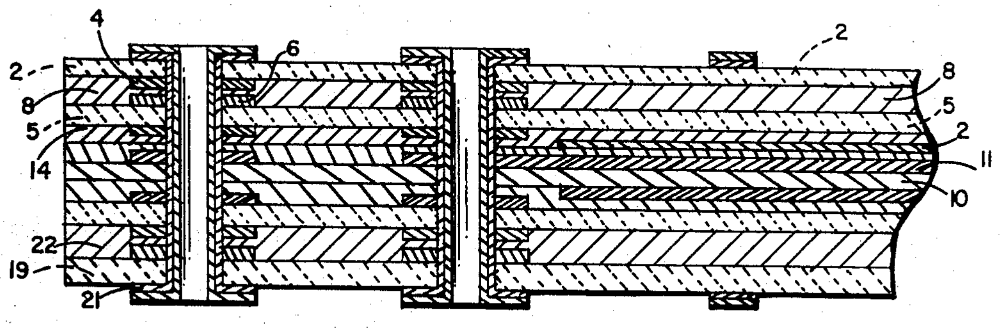
FIGURE 3 illustrates a cross-sectional view of the multilayer board during a subsequent stage of the process.

FIGURE 3 illustrates the board at a further stage of the process after the outside copper layers have been etched into a circuit configuration by using, for example, $FeCl_3$ as an etchant. The outside surfaces of epoxy glass substrates 2 and 19 are exposed for further processing.

Figure 4:
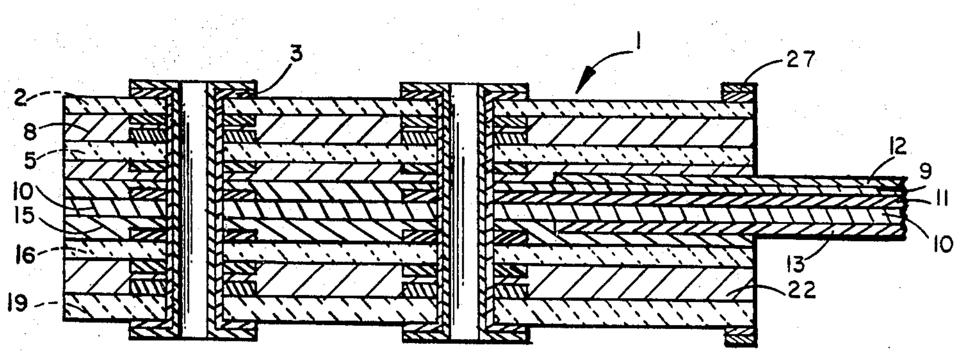
FIGURE 4 illustrates the multilayer board after the protective epoxy glass layers have been removed.

FIGURE 4 illustrates a cross-sectional view of the circuit board in which the epoxy glass substrates outside of border 27 have been etched to expose the circuitry layers 12 and 13 on both sides of the flexible layers. The remainder of the circuit is masked during the etching process so that only the portions outside the border are removed. An etchant of $HF/H_2SO_4$, for example, may be used.

Figure 5:
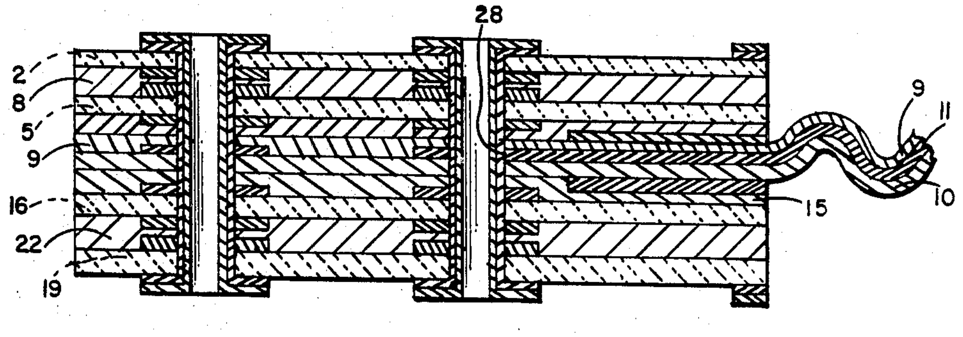
FIGURE 5 illustrates a cross-sectional view of the multilayer board showing the flexible circuit connector extending into the board.

FIGURE 5 illustrates the multilayer board after copper layers 12 and 13 have been etched, for example, by a $FeCl_3$ etchant to expose the flexible layers. As a result of interposing the flexible layers between epoxy glass layers of the multilayer board during the process, possible damage due to pinching, twisting, breaking, etc. is averted. The flexible layer is protected until the multilayer board process is completed.

Although the circuitry layer is shown as making an electrical contact at area 28 of the board, it should be understood that the circuitry pattern may be complex and may provide electrical connections to a plurality of circuits on each of the boards of the multilayer.

The extremity of the flexible connector, shown connected, may be connected to a power supply, signal source, output load, etc., for completing the electrical circuits during an electrical operation.

We claim:

1. A process for producing a flexible circuit connector as an integral layer of a multilayer board comprising the steps of, producing a circuit pattern between layers of an insulating and flexible material for forming a flexible connection, placing conductive layers over a predetermined dimensional area of said insulating and flexible layers, inserting said flexible connector including said conductive layers between rigid circuit boards of a multilayer board, said circuit boards and the flexible connector having the same dimensions, said circuit boards having an added dimension equal to said predetermined dimensional area covered by said conductive layers for protecting said flexible connector during the process for producing the board with the integral flexible connector, bonding the circuit boards and the flexible connector together, interconnecting circuits of said flexible connector with circuits of said multilayer board, first etching the added dimensional areas of said rigid circuit boards for exposing said conductive layers, second etching said conductive layers for exposing said flexible material.

2. The process recited in claim 1 including the steps of providing a border on the outer surfaces of said multilayer board for defining the dimensions of said board after the process is completed, and said first etching step removes the area outside said border.

3. The process recited in claim 1 wherein said electrical circuits of the flexible connector are produced by bonding a conductive layer to one of said insulative and flexible layers, and by etching said layer to a desired circuit pattern, thereafter, the remaining insulation and flexible layer is bonded to the exposed circuit pattern.

References Cited

UNITED STATES PATENTS

| | | | |
|---|---|---|---|
| 3,202,869 | 8/1965 | Matson et al. | 174—68.5 XR |
| 3,409,732 | 11/1968 | Dahlgren et al. | 174—68.5 |

DARRELL L. CLAY, Primary Examiner

U.S. Cl. X.R.

29—625; 156—2, 13; 174—68.5